United States Patent [19]

Goshima et al.

[11] 4,118,678

[45] Oct. 3, 1978

[54] COIL RETAINING CASE

[75] Inventors: Yoshio Goshima; Hisashi Osada, both of Tokyo, Japan

[73] Assignee: TDK Electronics Co., Ltd., Tokyo, Japan

[21] Appl. No.: 799,998

[22] Filed: May 24, 1977

[30] Foreign Application Priority Data

Dec. 22, 1976 [JP] Japan .......................... 51-172069[U]

[51] Int. Cl.$^{2}$ ...................... H03H 1/00; H01F 27/02; H01F 27/30; H05K 5/00

[52] U.S. Cl. .................................. 333/70 S; 333/29; 336/90

[58] Field of Search ..................... 333/70 R, 70 S, 77, 333/78, 29; 336/65, 68, 90, 92, 96, 199, 205, 208, 209, 210, 211; 174/45, 46, 52 R, 52 PE, 52 S, 50

[56] References Cited

U.S. PATENT DOCUMENTS

| | | | |
|---|---|---|---|
| 3,336,552 | 8/1967 | Davis | 336/96 |
| 3,349,405 | 10/1967 | Wright | 343/788 |
| 3,691,294 | 9/1972 | Charles | 336/65 X |

*Primary Examiner*—Alfred E. Smith
*Assistant Examiner*—Marvin Nussbaum
*Attorney, Agent, or Firm*—Oblon, Fisher, Spivak, McClelland & Maier

[57] ABSTRACT

An electronic part comprises a plastic core holder having a sectional ] shape which has an opening part and a stopper in one side and a bottom; and a plurality of drum cores having windings which are arranged in the core holder to contact the flanges of the adjacent drum cores.

2 Claims, 8 Drawing Figures

COIL RETAINING CASE

BACKGROUND OF THE INVENTION

1. Field of the Invention

The present invention relates to an improved electronic part.

2. Description of the Prior Art

Heretofore, as small size electronic parts as delay lines and LC filters, it has been well-known to use the electronic parts that a plurality of drum cores having windings are fixed on a substrate by bonding upper and lower flanges of the drum cores with a binder or an adhesive tape or the drum cores are fitted into a groove on a substrate and the windings are connected in series, and each capacitor is connected to each contact of the windings.

In the conventional small size electronic parts such as the delay lines and the LC filters, the bonding of the drum cores and the wiring of the windings have been the time consuming operation. The processability of the assemble has been inferior and the coupling coefficients between the windings wound on the drum cores have not been uniform because of the variation of the condition of contacting the adjacent drum cores. It has been difficult to provide the uniform condition contacting the drum cores whereby the coupling coefficients between the windings have not been uniform disadvantageously.

SUMMARY OF THE INVENTION

It is an object of the present invention to provide an improved electronic part which can be easily assembled in uniform contacts of drum cores to impart uniform coupling coefficients between windings.

The foregoing and other objects of the present invention have been attained by providing a plastic core holder having a sectional ] shape which has an opening part and a stopper in one side, and a bottom, and a plurality of drum cores having windings which are arranged in the core holder to contact the flanges of the adjacent drum cores.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, wherein like reference numerals designate identical or corresponding parts.

Figure 1A:
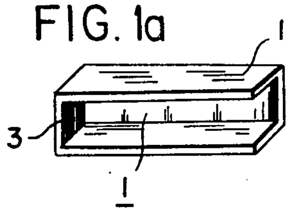
FIGS. 1*a, b* and *c* are respectively schematic views of core holders for the electronic part of the present invention.

DETAILED DESCRIPTION OF THE PREFERRED EMBODIMENTS:

Referring to the drawings, the embodiments of the present invention will be illustrated.

FIGS. 1*a, b* and *c* are respectively schematic views of embodiments of the core holder for the electronic parts of the present invention.

In FIG. 1*a,* the reference 1 designates a plastic core holder having bottom which has an opening part 1 at the front surface and has a sectional ] shape.

On one side surface of the core holder 1, a stopper 3 is formed as one body.

Figure 1B:
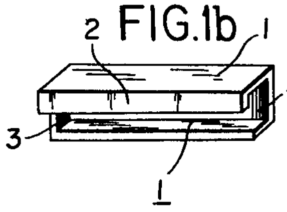
Figure 1C:
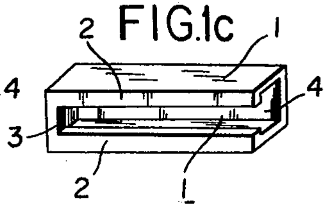

In FIGS. 1*b* and *c,* the stopper 3 is formed by projecting to the opening part 1. On the other side surface opposite to the stopper 3, an inlet for insertion 4 is formed.

Figure 2A:
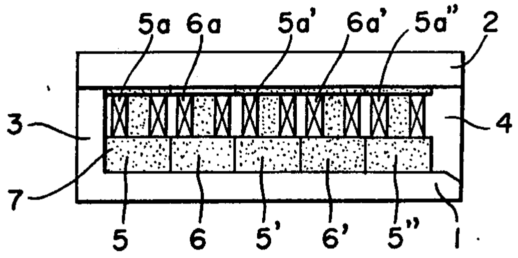
FIGS. 2*a* and *b* are respectively a plan view and a side view of one embodiment of the electronic part of the present invention.
Figure 2B:
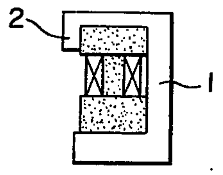

FIGS. 2*a* and *b* are respectively a plan view and a side view of the electronic part of the present invention in which the core holder 1 of FIG. 1*b* is used.

In FIGS. 2*a* and *b*, the references 5, 5' and 5'' respectively designate the drum cores having the windings 5*a*, 5*a'*, and 5*a''* having red color. The references 6 and 6' respectively designate the drum core having the windings 6*a* and 6*a'* having green color.

The drum cores 5, 5', 5'', 6 and 6' having the windings in different two colors are inserted into the core holder 1 by inserting the drum core 5 having the red windings from the inlet 4 into the hollow of the core holder 1, and then inserting the drum core 6 having the green windings into the hollow of the core holder 1, and then the other drum core 5' having the red windings into the hollow of the core holder 1. Thus, the drum cores 5, 5', 5'' and the drum cores 6, 6' having different color windings are sequentially inserted from the inlet 4 into the hollow part of the core holder 1 in the arrangement from the stopper 3 along the holding part 2 under contacting peripheral surfaces of the flanges 7 of the drum cores each other. A part of the core holder near the inlet 4 is deformed by a heat-press whereby the part of the core holder near the inlet 4 is molten to adhere it to the upper and lower flanges of the drum core which is finally inserted. The plurality of the drum cores 5, 5', 5'', 6, 6' are arranged and held in the core holder under contacting the upper and lower franges to those of the adjacent drum cores.

Figure 3:
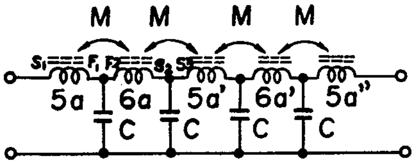
FIG. 3 is a circuit diagram of the electronic part.

The windings 5*a*, 6*a* wound on the adjacent drum cores are connected in series as shown in FIG. 3. The rear end $F_1$ of the red windings 5*a* wound on the drum core 5 is connected to the rear end $F_2$ of the green windings 6*a* wound on the drum core 6 and the beginning end $S_2$ of the green windings 6*a* is connected to the beginning end $S_3$ of the red windings 5*a'* wound on the adjacent drum core 5' in series. The lead wires from the contacts are respectively connected to the capacitors to form the electronic part of the present invention.

Incidentally, in the embodiment, the drum core 5 having the red windings 5*a* is firstly inserted into the core holder. It is also possible to firstly insert the drum core having different color windings into the core holder 1 when a plurality of the drum cores 5, 5', 5'', 6, 6' having the windings having two types of colors are alternatively inserted.

Figure 4A:
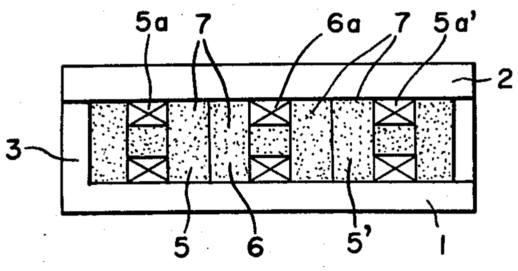
FIGS. 4*a* and *b* are respectively a plan view and a side view of the other embodiment of the electronic part.
Figure 4B:
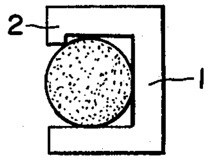

FIGS. 4 show the other embodiment of the electronic part of the present invention.

The drum cores 5 are inserted in transversal direction into the core holder 1 to contact the end surface of the flange 7 of the drum core 5 with the end surface of the flange 7 of the adjacent drum core 6 whereby the drum cores are arranged in the core holder 1.

The electronic part of the present invention is characterized by alternatively arranging a plurality of drum cores having windings having different colors such as two types of colors and bonding the drum cores in the core holder under contacting adjacent upper and lower flanges of the drum cores.

The core holder is preferably made of a plastic such as thermoplastic material or thermosettable material.

When a size of the core holder is relatively small, a thermoplastic such as polypropylene, ABS, polyvinyl chloride and nylon is preferably used because of high flexibility and moldability.

When a size of the core holder is relatively large, a thermosettable plastic can be used. An epoxy resin or PBT which has high heat resistance can be preferably used in order to form one body with a lead wire.

The inlet part of the plastic core holder is preferably heat sealed or bonded after inserting the cores. The core holder preferably has groove or projected side edge so as to hold the cores. The shape of the groove and the side edge can be selected as desired to prevent the movement of the cores in the core holder after the heat sealing.

The number of cores and the arrangement of cores having windings are selected as desired, depending upon the uses such as LC filter and delay line.

The lead wire can be formed as desired. For example, the lead wire can be connected to a substrate of a capacitor, or a base having terminals.

The core holder can have the outer surface for bonding or fitting on the base having terminals.

In accordance with the present invention, the arrangement of the drum cores are quite easy and the bonding operation of the drum cores in the core holder can be remarkably easy and accurate. The upper and lower flanges of the drum cores are tightly contacted with the adjacent ones whereby the coupling coefficients between windings wound on the drum cores can be uniform with less fluctuation thereof. The operation for connecting the windings can be easy and accurate whereby the productivity can be increased and the quality can be improved advantageous. The practical value of the present invention is remarkable.

What is claimed is:

1. An electronic part comprising:

a plastic core holder having a rectangular bottom wall, a pair of side walls appending at right angles from opposite lengthwise edges of said bottom wall, one of said side walls having a core retaining wall appending therefrom and extending toward the other of said side walls, and an end blocking wall appending at a right angle from a widthwise edge of said bottom wall, wherein said bottom wall, said side walls, said core retaining wall and said blocking wall are formed integrally of a plastic material and define an end access opening opposite said end blocking wall, and a side access opening between said other of said side walls and said retaining wall; and a plurality of drum cores, each having top and bottom flanges separated by a cylindrical body section, and windings wrapped around said body section, said drum cores disposed in said core holder through said end access opening with said flanges of adjacent cores contacting each other and said bottom wall, said side walls, and said retaining wall such that said drum cores are maintained in precise position within said holder, and said entire body section and said windings of said cores are completely visible and accessible through said side access opening, said drum cores bonded and sealed in said core holder at said end opening after disposition therein such that said drum cores are securely retained in said holder;

whereby the electrical coupling of adjacent cores are controlled as a result of the precise positioning of said cores within said holder, and electrical connection is made to said windings completely visible and accessible through said side access opening.

2. An electronic part according to claim 1, wherein the windings wound on each drum core have a distinct color.

* * * * *